United States Patent
Ovshinsky et al.

(10) Patent No.: US 7,529,123 B2
(45) Date of Patent: May 5, 2009

(54) METHOD OF OPERATING A MULTI-TERMINAL ELECTRONIC DEVICE

(75) Inventors: Stanford R. Ovshinsky, Bloomfield Hills, MI (US); Boil Pashmakov, Troy, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 193 days.

(21) Appl. No.: 11/451,740

(22) Filed: Jun. 13, 2006

(65) Prior Publication Data

US 2006/0234462 A1    Oct. 19, 2006

Related U.S. Application Data

(63) Continuation-in-part of application No. 10/761,022, filed on Jan. 20, 2004, now Pat. No. 7,186,998, and a continuation-in-part of application No. 10/657,285, filed on Sep. 8, 2003, now Pat. No. 7,227,170.

(51) Int. Cl.
*G11C 11/21* (2006.01)

(52) U.S. Cl. .................... 365/163; 365/148; 257/2; 257/4

(58) Field of Classification Search ............ 365/148, 365/163; 257/2, 4
See application file for complete search history.

(56) References Cited

U.S. PATENT DOCUMENTS

| | | | | |
|---|---|---|---|---|
| 3,271,591 A | * | 9/1966 | Ovshinsky | 327/500 |
| 3,748,501 A | * | 7/1973 | Fritzsche et al. | 327/574 |
| 4,015,282 A | * | 3/1977 | Shaw | 257/2 |
| 4,845,533 A | * | 7/1989 | Pryor et al. | 257/4 |
| 5,166,758 A | * | 11/1992 | Ovshinsky et al. | 257/3 |
| 5,296,716 A | * | 3/1994 | Ovshinsky et al. | 257/3 |
| 6,075,719 A | * | 6/2000 | Lowrey et al. | 365/148 |
| 7,009,694 B2 | * | 3/2006 | Hart et al. | 365/163 |
| 2002/0168820 A1 | * | 11/2002 | Kozicki et al. | 438/259 |
| 2003/0081446 A1 | * | 5/2003 | Fricke et al. | 365/105 |
| 2003/0137869 A1 | * | 7/2003 | Kozicki | 365/158 |
| 2003/0156452 A1 | * | 8/2003 | Gilton | 365/185.03 |
| 2005/0265072 A1 | * | 12/2005 | Hart et al. | 365/163 |

* cited by examiner

*Primary Examiner*—Hoai V Ho
*Assistant Examiner*—Jay Radke
(74) *Attorney, Agent, or Firm*—Kevin L. Bray

(57) ABSTRACT

A method of operating a multi-terminal electronic device. The device includes an active material in electrical communication with three or more electrical terminals. The active material is able to undergo a transformation from one state to another state, where the two states differ in resistance. The method includes the step of providing energy between one pair of terminals of the device, where the provided energy effects a change in the state of the active material adjacent to one or more other terminals of the device. In one embodiment, energy is applied between a first terminal and a second terminal of a three-terminal device and the state of the active material adjacent to the third terminal is altered. In one embodiment, energy is applied in the form of electrical energy and the active material is a phase change material that undergoes a transformation from one structural state to another structural state. The two structural states may include different volume fractions of a crystalline phase and an amorphous phase.

13 Claims, 5 Drawing Sheets

Structure of a 3-terminal Device

METHOD OF OPERATING A MULTI-TERMINAL ELECTRONIC DEVICE

RELATED APPLICATION INFORMATION

This application is a continuation-in-part of U.S. application Ser. No. 10/657,285 filed on Sep. 8, 2003 and entitled "Multiple Bit Chalcogenide Storage Device", now U.S. Pat. No. 7,227,170, the disclosure of which is hereby incorporated by reference herein, and a continuation-in-part of U.S. application Ser. No. 10/761,022 filed on Jan. 20, 2004 and entitled "Multi-Terminal Devices Having Logic Functionality", now U.S. Pat. No. 7,186,998, the disclosure of which is hereby incorporated by reference.

FIELD OF INVENTION

This invention pertains to electronic devices useful in the processing of information. More specifically, this invention pertains to a method of operating an electronic device having three or more terminals in electrical communication with an active material capable of undergoing a transformation between two or more states that differ in resistance. Most particularly, the instant invention relates to a method of providing energy between a pair of terminals of a multi-terminal device, where the energy provided induces a change in state of the active material adjacent to other terminals of the multi-terminal device.

BACKGROUND OF THE INVENTION

There is a continuing need to improve the performance of computers to meet the needs of new and more sophisticated computing applications. Applications such as pattern classification, pattern association, associative memory functions, speech, and character recognition remain largely unamenable to solution or implementation by current computers as are many tasks that are readily and intuitively performed by humans and other biological organisms.

The desire to expand the frontiers of computer science has prompted consideration of the factors that contribute to the limitations of current computers. Silicon is at the heart of today's computer. The advances in computing power and speed over the years have largely been a consequence of better understanding the fundamental properties of silicon and harnessing those properties for practical effect. Initial progress was predicated on building basic electronic components such as transistors and diodes out of silicon and later progress followed from the development of integrated circuits. More recent advances represent a continuation of these trends and currently emphasize miniaturization and the integration of an ever larger number of microelectronic devices on a single chip. Smaller devices lead to higher memory storage densities, more highly integrated circuits and reduced interaction times between devices on the same chip.

Since future improvements in computing power and functionality are currently predicated on further improvements in silicon technology, there has been much recent discussion about the prognosis for continued miniaturization of silicon-based electronic devices. A growing consensus is emerging that believes that the computer industry is rapidly approaching the performance limits of silicon. The feature size in today's manufacturing technologies is 0.18 micron and it is expected that this can be reduced to about 0.10 micron in the future. Further decreases in feature size, however, are deemed problematic because sizes below about 0.10 micron lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, energy states are quantized rather than continuous and phenomena such as tunneling lead to delocalization of electrons across many devices. Consequences of tunneling include leakage of current as electrons escape from one device to neighboring devices and a loss of independence of devices as the state of one device influences the state of neighboring devices. In addition to fundamental changes in the behavior of silicon, further decreases in the dimensions of silicon devices also pose formidable technological challenges. New and costly innovations in fabrication methods such as photolithography will be needed to achieve smaller feature sizes.

One strategy for advancing the capabilities of computers is to identify materials other than silicon that can be used as the active medium in data processing and/or storage applications. Such alternative computing media could be used independent of or in combination with silicon to form the basis of a new computing industry that seeks to offer better performance and more convenient manufacturing than is possible with silicon.

The instant inventors have recently proposed the use of chalcogenide phase change materials as an active material for the processing and storage of data. In U.S. Pat. No. 6,671,710 (the '710 patent), the disclosure of which is hereby incorporated by reference herein, Ovshinsky et al. describe a principle of operation of phase change materials in computing applications. Phase change materials can not only operate in the binary mode characteristic of conventional silicon computers, but also offer opportunities for the non-binary storage and processing of data. Non-binary storage provides for high information storage densities, while non-binary processing provides for increased parallelness of operation. The '710 patent also describes representative algorithms that utilize a non-binary computing medium for mathematical operations such as addition, subtraction, multiplication and division. U.S. Pat. No. 6,714,954 (the '954 patent) by Ovshinsky et al., the disclosure of which is hereby incorporated by reference herein, describes farther mathematical operations based on a phase change computing medium, including factoring, modular arithmetic and parallel operation.

In U.S. Pat. No. 6,999,953 (the '953 patent), the disclosure of which is hereby incorporated by reference herein, Ovshinsky considers the architecture of computing systems based on devices utilizing a phase change material as the active computing medium. More specifically, Ovshinsky considers networks of phase change computing devices and demonstrates functionality tat closely parallels that of biological neural networks. Important features of this functionality include the accumulative response of phase change computing devices to input signals from a variety of sources, an ability to weight the input signals and a stable, reproducible material transformation that mimics the firing of a biological neuron. This functionality enables a new concept in intelligent computing that features learning, adaptability, and plasticity.

In U.S. Pat. Nos. 6,967,344 (the '344 patent); U.S. Pat. No. 6,969,867 (the '867 patent); and U.S. Pat. No. 7,227,170 (the '170 patent), the disclosures of which are hereby incorporated by reference herein, Ovshinsky et al. further develop the notion of phase change computing by discussing additional computing and storage devices. The '344 patent discusses a multi-terminal phase change device where a control signal provided at one electrical terminal modulates the current, threshold voltage or signal transmitted between other electrical terminals through the injection of charge carriers. The '867 patent describes a related multi-terminal device that utilizes a field effect terminal to modulate the current, threshold voltage or signal transmitted between other terminals. The devices described in the '344 and '867 patents may be configured to provide a functionality analogous to that of the transistor that is so vital to silicon based computers. The '170 patent presents a multiple bit storage device having multiple terminals that utilizes a phase change material.

The foregoing work by Ovshinsky et al. provides a concept, operating principles and some basic devices to enable a computing paradigm based in whole or in part on chalcogenide or other phase change materials. In order to further the realization of chalcogenide computing as a viable complement or alternative to silicon-based technologies, it is desirable to expand the range of devices and functionality available from chalcogenide phase change materials. Of greatest interest are devices and systems capable of performing processing, storage or memory, and logic functions.

SUMMARY OF THE INVENTION

The instant invention provides electronic devices having logic functionality based on phase change materials and methods of operating same. The instant devices include a phase change material as the working substance along with three or more electrical terminals in electrical communication therewith. The phase change material is capable of reversibly transforming among a plurality of structural states including a crystalline state, a partially crystalline state and an amorphous state and displays an electrical resistance that may vary over a range of multiple orders of magnitude. Logic functionality is achieved by applying input signals to the electrical terminals to selectively programming specific portions of the phase change material to pre-determined structural states having desired resistances in such a way that the pattern of resistances between pre-selected pairs of the three or more terminals conforms to the truth table of a logic operation.

In one embodiment of the instant invention, an AND device is provided.

In another embodiment of the instant invention, an OR element is provided.

For a better understanding of the instant invention, together with other and further objects thereof, reference is made to the following description, taken in conjunction with the accompanying drawings and claims.

DETAILED DESCRIPTION OF THE ILLUSTRATED EMBODIMENTS

Figure 1:
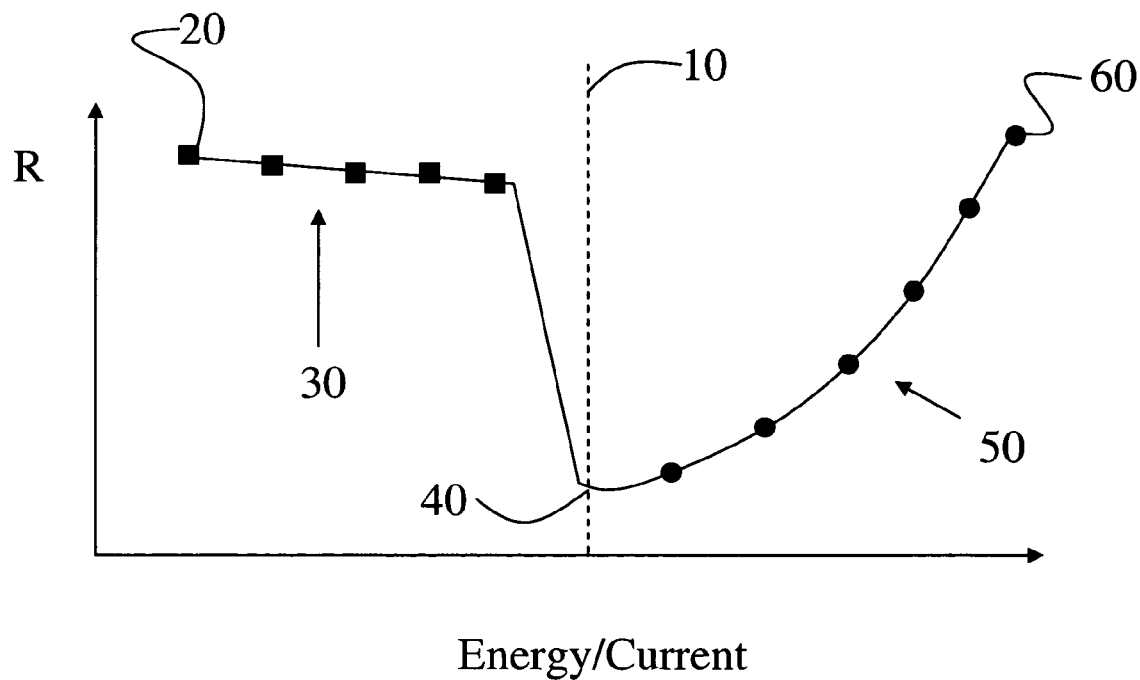
FIG. 1. Representative dependence of the electrical resistance of a chalcogenide material as a function of energy or current.

The instant invention provides generally for logic elements or devices in a non-silicon based computing technology and methods of programming or operating non-silicon based devices to achieve logic functionality. The instant devices and elements include a phase change material and three or more electrical terminals in electrical communication therewith. The application of electrical signals to or across one or more electrical terminals programs the resistance of the phase change material, in whole or in part, with variations or differences in electrical resistance between different pairs of terminals providing a basis for logic functionality as described hereinbelow.

Phase change materials suitable for use in the instant logic devices are materials capable of transforming between or among two or more detectably distinct structural states. The distinct structural states may be distinguished on the basis of, for example, crystal structure, atomic arrangement, order or disorder, fractional crystallinity, relative proportions of two or more different structural states, a physical (e.g. electrical, optical, magnetic, mechanical) or chemical property etc. In a preferred embodiment, the transformations between or among structural states are reversible so that the original state of a transformed material can be restored subsequent to a structural transformation.

In a preferred embodiment, chalcogenide materials are used as the phase change material in the instant invention. Chalcogenide materials have been previously utilized in optical and electrical memory and switching applications and some representative compositions and properties have been discussed in in U.S. Pat. Nos. 5,543,737; 5,694,146; 5,757,446; 5,166,758; 5,296,716; 5,534,711; 5,536,947; 5,596,522; and 6,087,674; the disclosures of which are hereby incorporated by reference herein, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference herein. General characteristics and comments about phase change chalcogenide materials are reviewed in the context of the instant invention in the following discussion.

Representative chalcogenide materials suitable for use in the instant invention are those that include one or more elements from column VI of the periodic table (the chalcogen elements) and optionally one or more chemical modifiers from columns III, IV or V. One or more of S, Se, and Te are the most common chalcogen elements included in the chalcogenide data storage material of the instant memory devices. Suitable modifiers include one or more of trivalent and tetravalent modifying elements such as As, Ge, Ga, Si, Sn, Pb, Al, Sb, In, and Bi. Transition metals such as Cu, Ni, Zn, Ag, and Cd may also be used as modifiers. A preferred chalcogenide composition includes one or more chalcogenide elements along with one or more trivalent or tetravalent modifiers and/or one or more transition metal modifiers. Materials that include Ge, Sb, and/or Te, such as $Ge_2Sb_2Te_5$, are examples of chalcogenide materials in accordance with the instant invention.

The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament in switching applications. The conducting filament may also contribute to or aid in driving phase changes that occur between different structural states. Trivalent, tetravalent and transition metal modifiers may enter the chain and ring structures of chalcogen elements and provide points for branching and crosslinking. The structural rigidity of chalcogenide materials depends on the extent of crosslinking and influences their ability to undergo crystallization or other structural transformations or rearrangements.

An important feature of the chalcogenide materials in the context of the instant invention is their ability to undergo a reversible phase transformation between or among two or more structural states. The chalcogenide materials have structural states that include a crystalline state, one or more partially crystalline states and an amorphous state. The crystalline state may be a single crystalline state or a polycrystalline state. As used herein, a partially crystalline state refers to a structural state of a volume of chalcogenide material that includes an amorphous portion and a crystalline portion. Preferably, a plurality of partially crystalline states exists for the phase change material that may be distinguished on the basis of the relative proportion of the amorphous and crystalline portions. Fractional crystallinity is one way to characterize the structural states of a chalcogenide phase change material. The fractional crystallinity of the crystalline state is 100%, the fractional crystallinity of the amorphous state is 0%, and the partially crystalline states have fractional crystallinities that vary continuously between 0% (the amorphous limit) and 100% (the crystalline limit). Phase change chalcogenide materials are thus able to reversibly transform among a plurality of structural states that vary inclusively between fractional crystallinities of 0% and 100%.

The ability and facility of a chalcogenide material to undergo structural transformations among structural states having various fractional crystallinities depends on the composition and structural characteristics of the chalcogenide material. More highly crosslinked chalcogenide materials are more structurally rigid and generally include a higher concentration of modifiers. The more highly crosslinked chalcogenide materials are more difficult to crystallize because the atomic rearrangements required to nucleate and grow a crystalline phase are inhibited due to the rigidity of the structure. More lightly crosslinked chalcogenide materials more readily undergo full or partial crystallization.

Transformations among the structural states of a chalcogenide material are induced by providing energy to the chalcogenide material. Energy in various forms can influence the fractional crystallinity of a chalcogenide material and hence, induce structural transformations. Suitable forms of energy include electrical energy, thermal energy, optical energy or other forms of energy that induce electrical, thermal or optical effects in a chalcogenide material (e.g. particle beam energy) or combinations of the foregoing forms of energy. Continuous and reversible variability of the fractional crystallinity is achievable by controlling the energy environment of a chalcogenide material. A crystalline state can be transformed to a partially crystalline or an amorphous state, a partially crystalline state can be transformed to a crystalline or amorphous state, and an amorphous state can be transformed to a partially crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially crystalline or crystalline state by heating a chalcogenide material above its melting temperature and cooling at a rate sufficient to inhibit the formation of crystalline phases. A crystalline phase may be formed from an amorphous or partially crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially crystalline state is lower than the free energy of an amorphous state so that the overall energy of a chalcogenide material decreases as the fractional crystallinity increases. Formation (nucleation and growth) of a crystalline state or crystalline domains within a partially crystalline state is kinetically inhibited, however, so that heating below the melting point promotes crystallization by providing energy that facilitates the rearrangements of atoms needed to form a crystalline phase or domain. The fractional crystallinity of a partially crystalline state can be controlled by controlling the temperature or time of heating of crystalline or partially crystalline state or by controlling the temperature or rate of cooling of an amorphous or partially crystalline state.

The use of electrical energy to induce structural transformations relies on the application of electrical (current or voltage) pulses to a chalcogenide material. The mechanism of electrically induced structural transformations may be electronic in nature, possibly with an accompanying or consequent thermal contribution. By controlling the magnitude and/or duration of electrical pulses applied to a chalcogenide material, it is possible to vary continuously vary the fractional crystallinity. The influence of electrical energy on the structure of a chalcogenide material is frequently depicted in terms of the variation of the electrical resistance of a chalcogenide material with the amount of electrical energy provided or the magnitude of the current or voltage pulse applied to a chalcogenide material. A representative depiction of the electrical resistance (R) of a chalcogenide material as a function of electrical energy or current pulse magnitude (Energy/Current) is presented in FIG. 1 herein. FIG. 1 shows the variation of the electrical resistance of a chalcogenide material with electrical energy or current pulse magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or gradually varying electrical resistance with increasing electrical energy that culminates in an abrupt decrease in resistance beyond a threshold energy. The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or gradually sloping. The left side of the resistance plot is referred to as the accumulating regime because the structural state of the chalcogenide material continuously evolves as energy is applied with the fractional crystallinity of the structural state correlating with the total accumulation of energy. The leftmost point 20 corresponds to the structural state in the accumulating regime having the lowest fractional crystallinity. This state may be fully amorphous or may contain some initial crystalline content. As energy is added, the fractional crystallinity increases and the chalcogenide material transforms in the direction of increasing energy among a plurality of partially crystalline states along the plateau 30. Selected accumulation states (structural states in the accumulation region) are marked with squares in FIG. 1. Upon accumulation of a threshold amount of energy, the fractions) crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing energy within the plateau region 30 and are reversible only by first driving the chalcogenide material through the set point 40 and resetting as described in, for example, the '954 and '953 patents.

While not wishing to be bound by theory, the instant inventors believe that the addition of energy to a chalcogenide material in the accumulating regime leads to an increase in fractional crystallinity through the nucleation of new crystalline domains, growth of existing crystalline domains or a combination thereof. It is believed that the electrical resistance varies only gradually along the plateau 30 despite the increase in fractional crystallinity because the crystalline domains form or grow in relative isolation of each other so as to prevent the formation of a contiguous crystalline network that spans the chalcogenide material. This type of crystallization may be referred to as sub-percolation crystallization. The setting transformation coincides with a percolation threshold in which a contiguous, interconnected crystalline network forms within the chalcogenide material. Such a network may form, for example, when crystalline domains increase sufficiently in size to impinge or overlap with neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially crystalline state lacking a contiguous crystalline network. Sub-percolation crystallization commences with an initial amorphous or partially crystalline state and progresses through a plurality of partially crystalline state having increasingly higher fractional crystallinities until the percolation threshold and setting transformation occur. Further discussion of the behavior of chalcogenide materials in the accumulation regime is provided in the '710, '954, and '953 patents and in U.S. Pat. Nos. 5,912,839 and 6,141,241; the disclosures of which are hereby incorporated by reference herein.

The regime to the right of the line 10 of FIG. 1 may be referred to as the greyscale regime or greyscale region. The greyscale regime extends from the set state 40 through a plurality of intermediate states (generally depicted by 50) to a reset point or state 60. The various points in the greyscale regime may be referred to as greyscale states of the chalcogenide material. Selected greyscale states are marked with circles in FIG. 1. Structural transformations in the greyscale regime may be induced by applying an electric current or voltage pulse to a chalcogenide material. In FIG. 1, an electric current pulse is indicated. In the greyscale regime, the resistance of the chalcogenide material varies with the magnitude of the applied electric pulse. The resistance of a particular state in the greyscale regime is characteristic of the structural state of the chalcogenide material and the structural state of a chalcogenide material is dictated by the magnitude of the current pulse applied in the greyscale region. The fractional crystallinity of the chalcogenide material decreases as the magnitude of the current pulse increases. The fractional crystallinity is highest for greyscale states at or near the set point 40 and progressively decreases as the reset state 60 is approached. The chalcogenide material transforms from a structural state possessing a contiguous crystalline network at the set state 40 to a structural state that is amorphous or substantially amorphous or partially crystalline without a contiguous crystalline network at the reset state 60. The application of current pulses having increasing magnitude has the effect of converting portions of the crystalline network into an amorphous phase and leads to a disruption or interruption of contiguous high conductivity crystalline pathways in the chalcogenide material. As a result, the resistance of the chalcogenide material increases as the magnitude of an applied current pulse increases in the greyscale region.

In contrast to the accumulating region, structural transformations that occur in the greyscale region are reversible and bi-directional. The response of a chalcogenide material to a current pulse is determined by the magnitude of the current pulse relative to the magnitude of the current pulse associated with the initial state of the chalcogenide material at the time the current pulse is applied. As indicated hereinabove, each state in the greyscale region may be identified by its resistance and a current pulse magnitude where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the reset state along the greyscale resistance curve. Similarly, if the subsequent current pulse has a lower magnitude than the pulse used to establish the initial state, the fractional crystallinity of the chalcogenide material increases and the structural state is transformed from the initial state in the direction of the set state along the greyscale resistance curve. Further discussion of the properties of chalcogenide materials in the greyscale region may be found, for example, in U.S. Pat. Nos. 5,296,716 and 5,414,271; the disclosures of which are hereby incorporated by reference herein.

Figure 2:
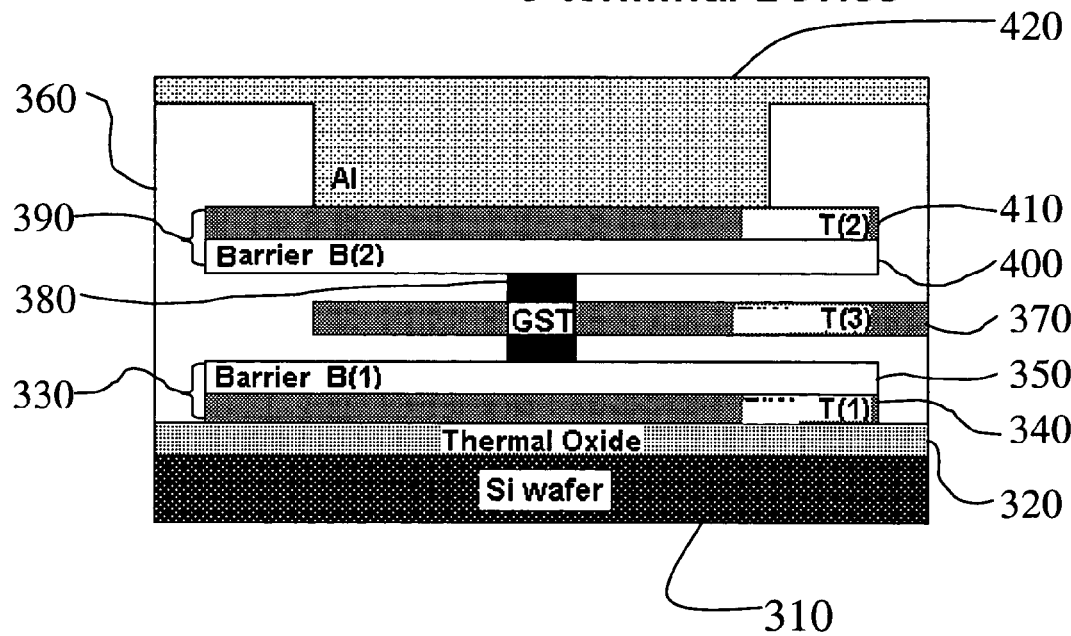
FIG. 2. One embodiment of a three-terminal device according to the instant invention.

One example of a device structure according to the instant invention is shown in FIG. 2. FIG. 2 shows a cross-sectional view of a three terminal device structure. The three terminals are labeled T(1), T(2), and T(3). A plurality of these devices was formed on a 6" silicon wafer. The devices and layers on the wafer were formed using conventional sputtering, chemical vapor deposition, etching, and lithography techniques. The structure includes a silicon wafer substrate 310, a thermal oxide layer 320, a bottom terminal 330 that includes a conductive layer 340 formed from TiW or a combination of Ti and TiN and a carbon barrier layer 350, an $SiO_x/SiN_x$ insulating region 360, an intermediate terminal 370 formed from TiW, a pore filled with a chalcogenide material 380, a top terminal 390 that includes a carbon barrier layer 400 and a conductive layer 410 that includes Ti and TiN, and an Al layer 420. In this example, the chalcogenide material 380 has the approximate composition $Ge_2Te_2Sb_5$ and is labeled GST in FIG. 2. The barrier layers inhibit diffusion and electromigration of material into the chalcogenide region and improve the cycle life of the device. Typical layer thicknesses are as follows: conductive layer 340 (100 nm), barrier layer 350 (30 nm), intermediate terminal 370 (10-40 nm), barrier layer 400 (100 nm), and conductive layer 410 (100 nm). The pore region occupied by the chalcogenide material in device of this example is cylindrical with a height of approximately 0.1 micron and a diameter of about 1 micron. The terminals 330, 370 and 390 are in electrical communication with the chalcogenide. The intermediate terminal 370 circumscribes the chalcogenide material 380. The terminals are separated by an insulating material so that electrical communication between terminals occurs through the chalcogenide material.

Figure 3:
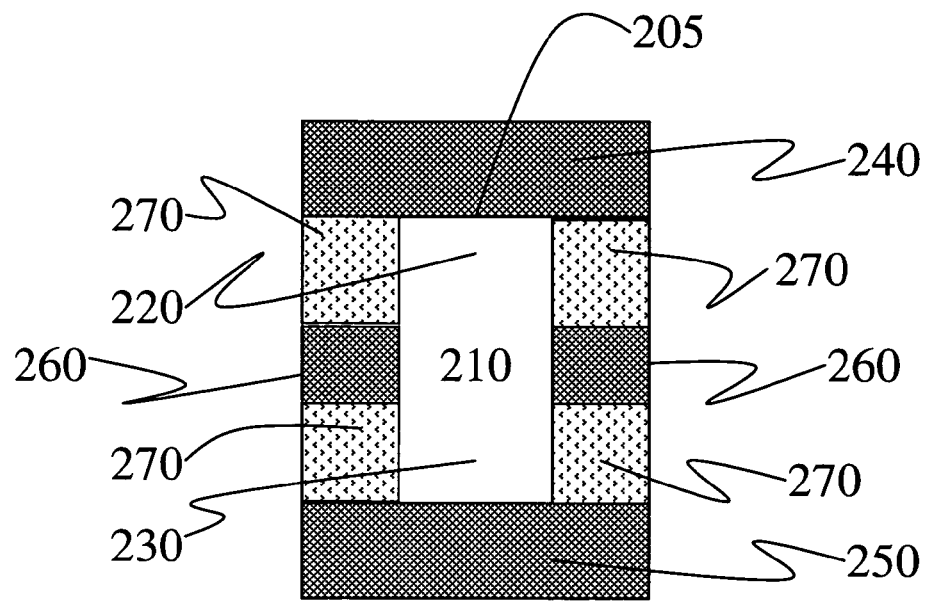
FIG. 3. Schematic depiction of a three-terminal chalcogenide storage device.

A schematic depiction of the central portion of a three-terminal device according to the instant invention is shown in FIG. 3. The device three includes a pore 205 filled with a chalcogenide material 210 that is in contact with a top electrical terminal 240, a bottom electrical terminal 250 and an intermediate electrical terminal 260. An insulating or dielectric material or materials 270 separates the electrical terminals 240, 250 and 260. The pore may be cylindrical or non-cylindrical in shape. If the pore 205 is cylindrical, the intermediate terminal 260 is preferably annular in shape. If the pore 205 is non-cylindrical, the intermediate terminal 260 is preferably circumferential in shape.

The presence of three terminals in the device of FIG. 3 provides for flexibility and selectivity in controlling the structural state of the chalcogenide material 210 or portions thereof in the pore of the device. Application of an appropriate electrical signal (e.g. current pulse, voltage pulse) between a pair of terminals influences the structural state of the chalcogenide material in the vicinity of those terminals and may thereby influence the resistance between those terminals. The operative structural states may be selected from the accumulation states or the greyscale states or a combination thereof. Since the device includes three terminals and since structural transformations of the chalcogenide material can be effected by providing electrical energy through any pair of terminals selected from the three terminals, the three terminal device provides for multiple options for the transformation of the structural state or resistance of the chalcogenide material and permits the influencing of all or selected regions of chalcogenide material in the pore 205 of the device.

In the '170 patent, a three terminal multibit chalcogenide storage device is described in which application of electrical signals to different pairs of terminals effects structural transformations in different portions of the chalcogenide material within a pore. In the multibit storage device of the '170 patent, the selection of terminals provides for the selective programming of specific and distinct portions within a continuous volume of chalcogenide material where each selectively programmed portion is influenced by a particular pair of terminals and provides for the storage of a single binary or non-binary bit The different structural states correspond to interpretatively distinct information content and may be characterized by, for example, fractional crystallinity of the chalcogenide material where the fractional crystallinity in one portion or region of a pore may differ from the fractional crystallinity in other portions or regions of a pore.

In the logic devices of the instant application, particular pairs of terminals also influence the structural state of specific regions or portions of chalcogenide material within a pore. In the instant logic devices, however, the fractional crystallinity per se in the separately programmable regions within a pore is not necessarily determinative of the operation, performance or function of the device. Of generally greater importance is the resistance of the chalcogenide material and more specifically, the measured resistance of the chalcogenide material between particular pairs of terminals. As described more fully hereinbelow, the relative resistances measured between different pairs of terminals and the pattern of resistances measured between the set of distinct pairs of terminals in a device may be used to provide logic functionality.

The measured resistance between a pair of electrical terminals may depend not only on the resistance of the chalcogenide material, but also on the arrangement or spatial distribution of crystalline and amorphous regions within the chalcogenide material and the size and position of one or both terminals of a pair relative to the volume of chalcogenide material influenced by a signal placed between the terminals. As discussed hereinabove, the crystalline phase of a chalcogenide phase change material has a lower resistance than the amorphous phase. Thus, the measured resistance between a pair of terminals is lower when it is possible for current to pass wholly through crystalline regions when flowing between terminals in a resistance measurement. The path traveled by an electrical current when flowing from one terminal to another in a resistance measurement may be referred to herein as a current conducting pathway, pathway of current conduction, pathway of current flow, current path, current pathway etc. The measured resistance between a pair of electrical terminals depends on the resistance of the chalcogenide material along the current path. Since the current path need not necessarily extend over the full volume or cross-section of a pore, the measured resistance between terminals may differ from the resistance of the chalcogenide material located in the pore.

The current path from one terminal to another in a resistance measurement extends along a continuous path beginning at one terminal and ending at the other terminal. The current path may or may not be a straight line path connecting the terminal. A circuitous or bifurcated current path is also possible. The flow of current occurs preferentially along directions of low electrical resistance and to the extent possible given the magnitude and/or density of current, current flows through low resistance regions of a material while avoiding high resistance regions. Thus, in a phase change material that includes crystalline and amorphous regions, current flow occurs preferentially through the crystalline regions. If a continuous crystalline pathway extending from one terminal to the other in a resistance measurement is available, current flow occurs preferentially through this pathway with little or no current flowing through amorphous regions. If such circumstances are present, the measured resistance between the terminals will correspond closely to the resistance of the crystalline state of the phase change material, even if amorphous regions are present. If a continuous crystalline pathway is not present or if the magnitude of the current or current density is sufficiently high to saturate a crystalline pathway, current flow occurs in amorphous regions and a correspondingly higher measured resistance is obtained. As the volume fraction of amorphous regions increases in a pore, the availability of a continuous crystalline pathway decreases and current flows increasingly through amorphous regions leading to an increasingly higher measured resistance.

Based on the above considerations, both the volume fraction of crystallinity and the arrangement of crystalline regions within a chalcogenide material contained in the pore of a device influence the measured resistance between a pair of terminals. The availability of a continuous crystalline pathway between a pair of terminals facilitates a lowering of the measured resistance between the terminals, while the lack of a continuous crystalline pathway constrains the current to flow at least partially through one or more amorphous regions thereby leading to a higher measured resistance. For a particular volume fraction of crystalline regions, therefore, the arrangement or connectivity of crystalline regions is a contributing factor to the measured resistance between a pair of terminals. An arrangement that provides a continuous crystalline pathway that extends between the terminals, for example, leads to a lower measured resistance than an arrangement in which crystalline regions are disconnected, separated or otherwise isolated in whole or in part from each other. The ability to control the arrangement and/or connectivity of crystalline and amorphous regions relative to each other thus provides a degree of freedom in controlling the measured resistance between a pair of terminals.

A further factor influencing the measured resistance is the size or position of one or more electrical terminals relative to the crystalline and amorphous regions of a phase change material contained in the pore of a device. If the size or cross-section of a terminal is at least as large as the size or cross-section of the pore, the terminal fully overlaps the pore and is in electrical communication with the full cross-section of phase change material contained in the pore and has direct access to any contiguous crystalline pathway that may exist in the pore. In the situation where a contiguous crystalline pathway is present, current has the ability to flow directly from the terminal to this pathway without the need to flow through an amorphous region. The measured resistance may thus closely approximate that of the crystalline phase of the phase change material even though amorphous regions may be present in the pore. If, on the contrary, the size or cross-section of a terminal is less than the size or cross-section of the pore so that the terminal does not fully overlap the pore, the position of the terminal relative to any continuous crystalline pathway that may be present determines the access of current flowing through the terminal to that pathway. If the terminal overlaps an entry point to the continuous crystalline pathway, current may directly flow from the terminal to that pathway. If not, current must flow through an amorphous region before encountering the continuous crystalline pathway and the measured resistance increases accordingly.

Figures 4A, 4B, 4C:
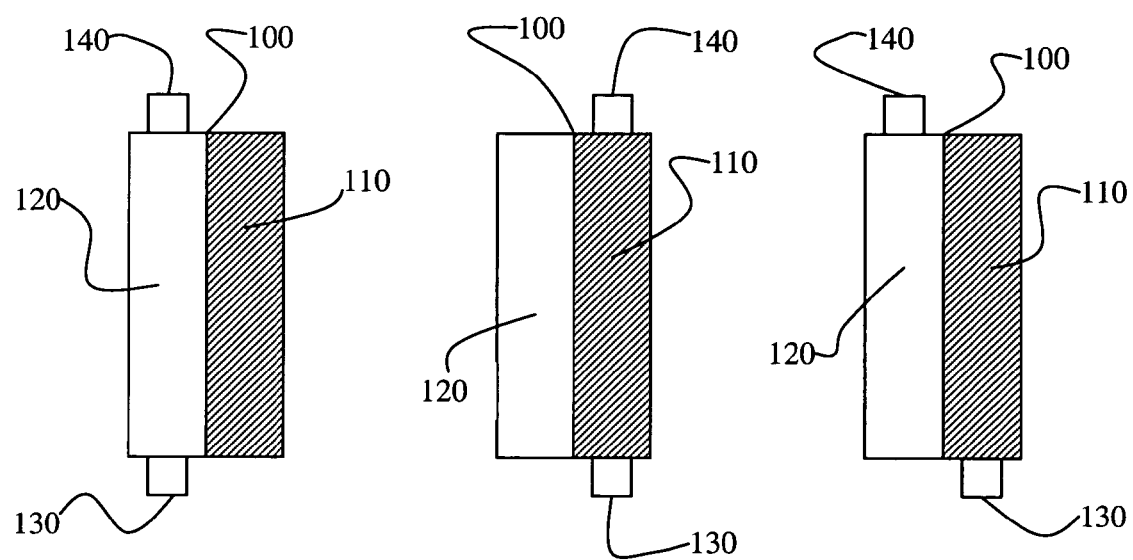
FIG. 4A. Schematic depiction of the placement of terminals relative to crystalline and amorphous regions of a phase change material in the pore region of a two terminal device.
FIG. 4B. Schematic depiction of the placement of terminals relative to crystalline and amorphous regions of a phase change material in the pore region of a two terminal device.
FIG. 4C. Schematic depiction of the placement of terminals relative to crystalline and amorphous regions of a phase change material in the pore region of a two terminal device.

An example of the importance of the position of electrical terminals relative to crystalline and amorphous regions of a chalcogenide material in the pore can be described using the schematic depictions provided in FIGS. 4A-4C. FIGS. 4A-4C show a pore 100 filled with a chalcogenide material having an amorphous region 110 and crystalline region 120 along with electrical terminals 130 and 140. The size of the electrical terminals 130 and 140 is smaller than the cross-section of the pore 100 so that the terminals overlap only a portion of the cross-section of the chalcogenide material occupying the pore. The position of the terminals 130 and 140 varies in the different examples shown in FIGS. 4A-4C. In FIG. 4A, the electrical terminals 130 and 140 both directly contact the crystalline region 120 so that the resistance measured across terminals 130 and 140 corresponds substantially to the resistance of the crystalline phase. In FIG. 4A, the high resistance of the amorphous region 110 inhibits the transfer or leakage of current from the crystalline region 120 to the amorphous region 110.

In FIG. 4B, the electrical terminals 130 and 140 both directly contact the amorphous region 110. If the current path occurs solely in the amorphous region 110, the measured resistance across terminals 130 and 140 of the example shown in FIG. 4B would correspond substantially to the resistance of the amorphous phase. A lower measured resistance between electrical terminals 130 and 140 would result if the current were to flow first from the amorphous region 110 to the crystalline region 120 and then back to the amorphous region 110. Regardless of the current pathway, however, the current must flow at least partially through the amorphous phase and thus a measured resistance that is greater than that of the crystalline phase of the phase change material results.

In FIG. 4C, terminal 130 is in direct contact with the amorphous region 110 and terminal 140 is in direct contact with the crystalline region 120. In this example, current flow is expected to occur largely in the crystalline region 120, but the current path must necessarily, however, include at least a portion of the amorphous region 110. The measured resistance in the example of FIG. 4C is expected to be intermediate between the resistances of the examples of FIGS. 4A and 4B.

Figure 5A:
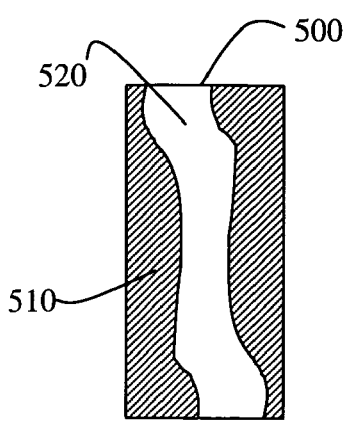
FIG. 5A. Schematic depiction of a crystalline pathway according to the instant invention.
Figure 5B:
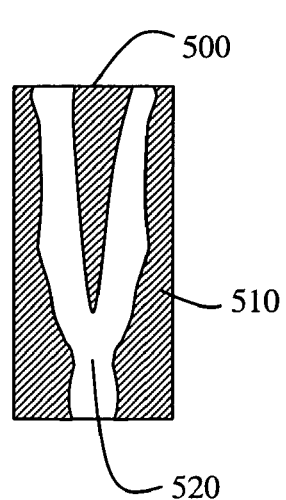
FIG. 5B. Schematic depiction of a crystalline pathway according to the instant invention.
Figure 5C:
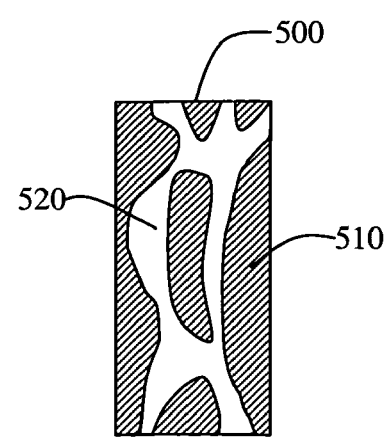
FIG. 5C. Schematic depiction of a crystalline pathway according to the instant invention.

The principles outlined in the schematic examples depicted in FIGS. 4A-4C apply generally irrespective of the particular shapes of the crystalline and amorphous regions. Low measured resistance between a pair of terminals is expected where a continuous crystalline pathway exists that electrically connects those terminals. The crystalline pathway may be straight, crooked, curved, arcuate, bifurcated, irregularly shaped etc. FIGS. 5A-5C show examples of more complex shapes of a continuous crystalline pathway. The examples shown in FIGS. 5A-5C include pores 500 that include amorphous regions 510 and crystalline regions 520. FIG. 5A shows a curved crystalline pathway, FIG. 5B shows a bifurcated crystalline pathway, and FIG. 5C shows a more complex crystalline network. In each of these examples, the measured resistance across the pore is lowest for a pair of electrical terminals, one of which is located somewhere at the top of the pore and one of which is located at the bottom of the pore, when both terminals are in direct electrical communication with the continuous crystalline pathway so that current flows through the crystalline pathway without substantially flowing through the amorphous region. A higher measured resistance occurs when one or both terminals overlaps, either fully or partially, an amorphous region so that current flows through at a portion of an amorphous region within the pore.

The instant logic devices include three or more terminals in electrical communication with a phase change material located in the pore of a device. Devices having three or more terminals provide for a plurality of ways of selecting pairs of terminals and provide a plurality of measured resistances between a pair of terminals of the device. Within a given device having a particular crystalline volume fraction and a particular arrangement of amorphous and crystalline regions, therefore, it may be possible to measure different resistance values between different selected pairs of terminals. In the instant logic devices, the relationship of measured resistances between different pairs of terminals in a multi-terminal (i.e. three or more terminals) device underlies a logic functionality.

Figure 6A:
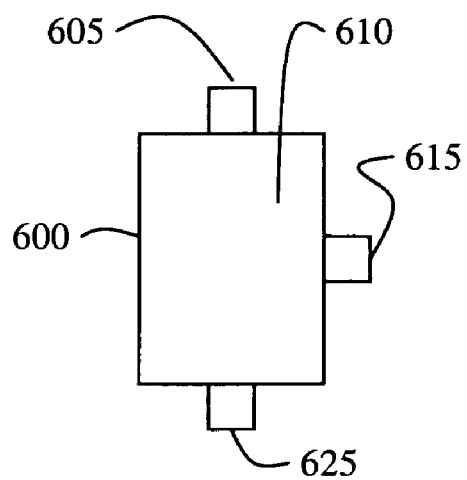
FIG. 6A. Schematic depiction of a three-terminal embodiment of the instant invention having a uniform or homogeneous phase change material in the pore region.

Consider, by way of example, the three-terminal device depicted schematically in FIG. 6A. The device includes a pore 600 filled with a phase change material 610 having electrical terminals 605, 615 and 625 in electrical communication therewith. In this device, pairwise resistance measurements can be made between terminals 605 and 615, terminals 605 and 625, and terminals 615 and 625. Depending on the arrangement of crystalline and amorphous regions within the phase change material 610, different measured resistances between different pairs of terminals may result. An important consideration is whether a continuous crystalline pathway is present between a particular pair of terminals and how many pairs of terminals in a multi-terminal device are directly connected by a crystalline pathway.

For illustration purposes we may consider a binary logic system having the logic values "0" and "1" where the different logic values correspond to detectably different measured resistances between a pair of electrical terminals. For practical convenience, it is preferable to have a wide difference in the measured resistances of the two logic states so that the logic states can be most readily distinguished and discriminated. One approach for achieving this objective is to associate one logic value to the situation where a continuous crystalline pathway is present between a pair of terminals and the other logic value to the situation where a continuous crystalline pathway is not present between a pair of terminals. In the latter situation, in order for current to flow between the terminals, it is necessary for it to flow at least in part through an amorphous region. As a result, the measured resistance will be increased relative to the former situation where the current flow occurs substantially within a continuous crystalline region. In one embodiment of binary logic, a reference resistance may be defined and measured resistances above the reference resistance may be assigned one logic value while measured resistances below the reference resistance may be assigned the other logic value. A resistance above a reference value may be referred to as a high resistance or high logic state and may be associated, for example, with a logic value "1". Similarly, a resistance below a reference value may be referred to as a low resistance or low logic state and may be associated, for example, with a logic value "0". In another embodiment, definition of a reference resistance is not needed and high and low logic values may be assigned to measured resistance states having high and low resistance, respectively, where the high and low resistance measured states correspond to current pathways between a pair of terminals that differ detectably in the degree to which current flows through one or more amorphous regions.

Figure 6B:
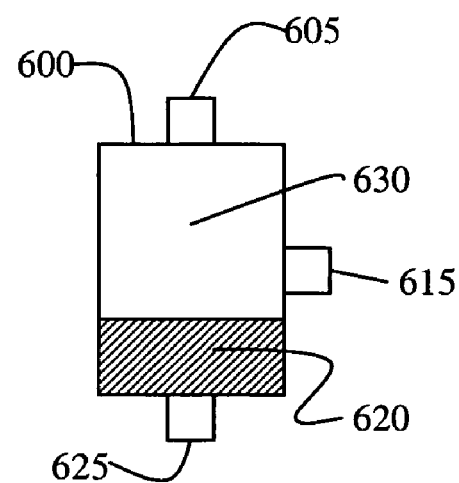
FIG. 6B. Schematic depiction of a three-terminal embodiment of the instant invention having a non-uniform or non-homogeneous phase change material in the pore region.

The presence of differences in the measured resistances between different pairs of terminals in a multi-terminal device depends on the relative amounts and spatial distribution of crystalline and amorphous regions. In the embodiment shown in FIG. 6A, for example, if the chalcogenide material 610 is uniformly or homogeneously amorphous or crystalline, the measured resistances between the three pairs of terminals would be substantially identical. Small variations in the measured resistance may occur due to e.g. differences in the spatial separation of different pairs of terminals, differences in terminal size of different terminals, differences in the contact area of different terminals etc. Such differences, however, are secondary in comparison to any differences in the degree to which the current pathway is crystalline or amorphous between different pairs of terminals.

Where the structural state of the chalcogenide is non-homogeneous or non-uniform, it becomes possible to observe appreciable differences in the measured resistance between different pairs of terminals. FIG. 6B shows an example of an embodiment of the three-terminal device shown in FIG. 6A having a non-homogeneous or non-uniform distribution of crystalline and amorphous regions. The device of FIG. 6B includes electrical terminals 605, 615 and 625 in electrical communication with a phase change material contained in the pore 600, where the phase change material includes an amorphous region 620 and a crystalline region 630. In this device, any current flowing to or from terminal 625 necessarily must pass through a substantial distance within amorphous region 620 thereby leading to a high measured resistance value. The measured resistances between terminals 625 and 605 and terminals 625 and 615 are therefore high in comparison to the measured resistance between terminals 605 and 615 for which a continuous crystalline pathway is available for current flow.

Figure 6C:
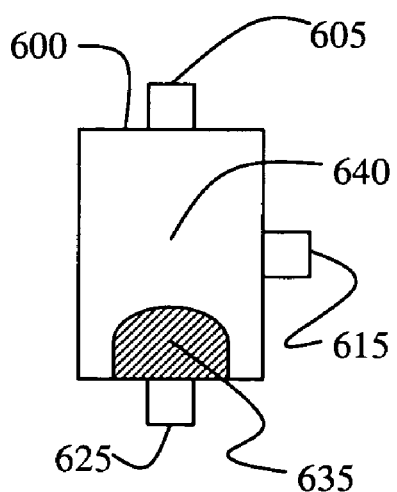
FIG. 6C. Schematic depiction of a three-terminal embodiment of the instant invention having a non-uniform or non-homogeneous phase change material in the pore region.

High measured resistance values will occur generally between a pair of terminals when one or both of the terminals are surrounded by an amorphous region so that no direct contact with a crystalline region is possible. Terminal 625 shown in FIG. 6B is an example of a terminal surrounded by an amorphous region. FIG. 6C shows another example where terminal 625 is surrounded by an amorphous region. FIG. 6C shows a three terminal device having terminals 605, 615 and 625 in electrical communication with a pore 600 containing a phase change material having an amorphous region 635 and crystalline region 640. The pattern of resistances between pairs of terminals in FIG. 6C corresponds with that of FIG. 6B. Namely, the measured resistances between terminals 625 and 615 and terminals 625 and 605 is high, while the measured resistance between terminals 615 and 605 is low. The example of FIG. 6C shows that the amorphous region need not extend across the full diameter or cross-section of the pore to create a high resistance conduction pathway between a pair of terminals.

Figure 6D:
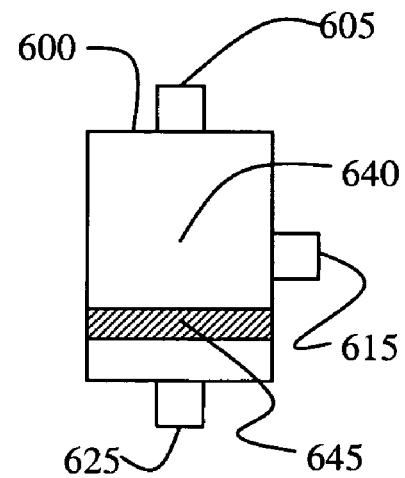
FIG. 6D. Schematic depiction of a three-terminal embodiment of the instant invention having a non-uniform or non-homogeneous phase change material in the pore region.

High measured resistance values may also result even when each terminal of a pair is in direct contact with a crystalline region if an intervening amorphous region that extends across the full diameter or cross-section of the pore is present between the terminals. An example of a situation of this type is depicted in FIG. 6D which shows a three-terminal device having electrical terminals 605, 615 and 625 in electrical communication with a pore 600 containing a phase change material having amorphous region 645 and crystalline regions 650 and 655. Note that terminal 625 is in direct contact with crystalline region 650. In the example of FIG. 6D, however, current flowing between terminal 625 and either terminal 605 or terminal 615 necessarily flows through amorphous region 645 with the result that the measured resistances between terminal 625 and terminal 605 or terminal 615 is high. The measured resistance between terminals 605 and 615, in contrast, remains low since a continuous crystalline pathway extends between this pair of terminals.

In the examples of FIGS. 6B, 6C and 6D, the amorphous regions 620, 635 and 645 may be said to resistively shield terminal 625 from terminals 605 and 615. Resistive shielding occurs when an amorphous region is of such a size and/or shape to preclude current flow to or from a terminal through a crystalline conductive pathway. Instead, current flow to or from a resistively shielded terminal necessarily occurs at least in part through an amorphous region so that the measured resistance between a shielded terminal and at least one other terminal is higher than it would be if a continuous crystalline current pathway were available. A particular terminal may be resistively shielded from some terminals, but not all terminals of a multi-terminal device. In the examples shown in FIGS. 6B, 6C and 6D, for example, terminal 625 is resistively shielded from each of terminals 605 and 615 and each of terminals 605 and 615 is resistively shielded from terminal 625. Terminals 605 and 615, however, are not resistively shielded from each other since a continuous crystalline pathway is available for current flow between these terminals.

Amorphous regions such as regions 620, 635 and 645 in the examples of FIGS. 6B, 6C and 6D may be referred to herein as resistively shielding amorphous regions since they serve to resistively shield a terminal from other terminals. A resistively shielding amorphous region may have an arbitrary shape provided that the shape is such that a continuous crystalline pathway between at least one pair of terminals is unavailable or the shape is such that the measured resistance between at least one pair of terminals is higher than it would be if the resistively shielded amorphous were absent. Note that a resistively shielding amorphous region does not prevent current from flowing between a resistively shielded terminal and other terminals, but rather acts to increase the measured resistance between a resistively shielded terminal and at least one other terminal in a multi-terminal device relative to a situation where the resistively shielding amorphous region is absent. A resistively shielding amorphous region may or may not completely surround a terminal and may or may not extend across a full cross-sectional dimension of a pore.

In the instant logic devices, the instant inventors are able to selectively control the formation of amorphous regions in the pore region of phase change device through application of appropriate input signals and are able to direct the placement of one or more resistively shielding amorphous regions so that the measured resistance between particular pairs of terminals can selectively be made high. The instant inventors can also selectively remove amorphous resistively shielding regions through selective crystallization upon application of appropriate input signals. In a binary logic system, a high measured resistance resulting from appropriate placement of a resistively shielding amorphous region may correspond to one logic value, while a low measured resistance resulting from the absence of a resistively shielding amorphous region may correspond to the other logic value. By reading the relative resistances (e.g. high vs. low) between different pairs of terminals, a binary logic functionality may be defined and application of the instant devices as logic devices may be achieved in a manner that is now described.

Figure 7:
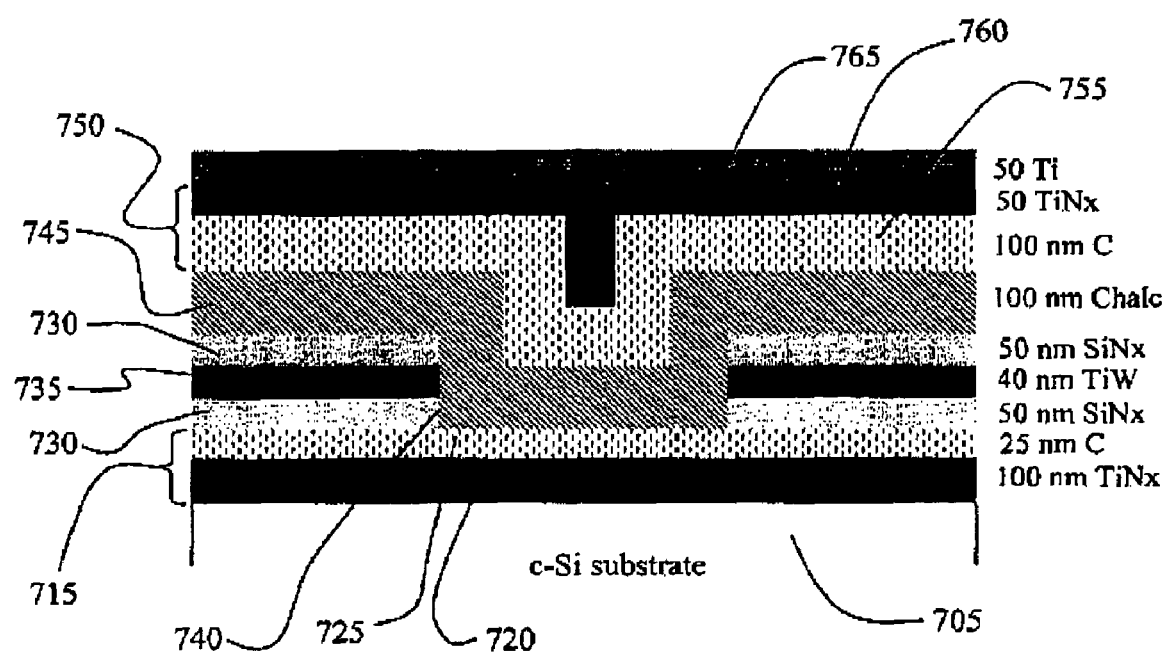
FIG. 7. An embodiment of a three-terminal device according to the instant invention.

As indicated hereinabove, the device shown in FIG. 2 and the schematic depiction of the central portion of a three-terminal device as shown in FIG. 3 are representative three-terminal devices according to the instant invention. A further example of a device according to the instant invention is shown in FIG. 7, which shows a cross-sectional view of a three terminal device structure. A plurality of these devices was formed on a 6" silicon wafer. The devices and layers on the wafer were formed using conventional sputtering, chemical vapor deposition, etching, and lithography techniques. The structure includes a silicon wafer substrate 705, a bottom terminal 715 that includes a conductive layer 720 formed from a combination of Ti and TiN and a carbon barrier layer 725, $SiN_x$ insulating regions 730, an intermediate terminal 735 formed from TiW, a pore 740 containing a chalcogenide material 745 extending beyond the diameter of the pore, a top terminal 750 that includes a carbon barrier layer 755 and a conductive layer 760 that includes Ti and TiN, and a Ti layer 765. Terminals 750, 735 and 715 may be referred to herein as the top, intermediate and bottom terminals, respectively. In this example, the chalcogenide material 745 has the approximate composition $Ge_2Te_2Sb_5$. The pore region occupied by the chalcogenide material in the device of FIG. 7 has a diameter of about 500 nm. The terminals 715, 735 and 750 are in electrical communication with the chalcogenide. The intermediate terminal 735 circumscribes the pore 740. The terminals are separated by an insulating material so that electrical communication between terminals occurs primarily through the chalcogenide material.

The device shown in FIG. 7 differs from the device shown in FIG. 2 primarily in the area of contact between the phase change material and the top terminal. In the device of FIG. 2, an additional polishing step has been included in the fabrication of the device to remove those portions of the phase change material that extend beyond the diameter of the pore. In the device of FIG. 7, the phase change material residing beyond the diameter of the pore is not removed. As a result, the area of contact between the top terminal and phase change material in the device of FIG. 7 is greater than that of the device shown in FIG. 2.

The device shown in FIG. 7 has been experimented with to demonstrate the selective formation of resistively shielding amorphous regions. An initial state was selected in which the chalcogenide material 745 was in a primarily crystalline state in which a continuous crystalline pathway was present between each of the three pairs of terminals present. One or more amorphous regions may be present in the initial state, but no resistively shielding amorphous regions are present. In this initial state, resistances were measured across the different pairs of terminals with the following results: 8.5 kΩ (measured resistance between terminals' 715 and 750), 14 kΩ (measured resistance between terminals 715 and 735), and 4 kΩ (measured resistance between terminals 735 and 750).

According to the instant invention, amorphous regions generally, and resistively shielding amorphous regions in particular, may be selectively formed or erased in a phase change or chalcogenide material contained within the pore of a device by providing an appropriate electrical signal between pairs of electrical terminals. Electrical signals may be in the form of current or voltage and may be persistent or pulsed. Electrical signals that lead to a change in the crystalline volume fraction or alteration of the structural state of a phase change material in the pore of a device may hereinafter be referred to as programming signals. Programming signals alter the crystalline volume fraction or structural state by inducing the formation of new amorphous regions, the enlargement or reduction of existing amorphous regions, and/or the erasure (i.e. removal/crystallization) of existing amorphous regions. In a preferred embodiment, programming signals create or destroy resistively shielding amorphous regions by transforming crystalline regions or influencing the size and/or connectivity of existing amorphous regions. The size and/or connectivity may be increased to promote the formation of resistively shielding amorphous regions from crystalline regions or non-resistively shielding amorphous regions. Similarly, existing resistively shielding amorphous regions may become erased in whole or in part or become disconnected to form non-resistively shielding amorphous regions and/or crystalline regions.

EXAMPLE 1

The selective formation of resistively shielding amorphous regions has been demonstrated by the instant inventors using the device shown in FIG. 7 through the application of suitable programming signals. Current pulses were used as programming signals in this demonstration. In a first experiment, the device was in the initial state described hereinabove and a current pulse was subsequently applied between terminals 735 and 750. The current pulse had an amplitude of ca. 2-5 mA and a duration of ca. 100 ns. After applying the current pulse, the resistances between the different pairs of terminals were measured. The following results were obtained: 8.0 kΩ (measured resistance between terminals 715 and 750, compared to 8.5 kΩ in the initial state), 50 kΩ (measured resistance between terminals 715 and 735, compared to 14 kΩ in the initial state), and 34 kΩ (measured resistance between terminals 735 and 750, compared to 4 kΩ in the initial state). The results indicate that the measured resistance between intermediate terminal 735 and either terminal 715 or 750 increases dramatically, while the resistance between terminals 715 and 750 is essentially unchanged. From the point of view of the instant logic applications, the results shows that the programming pulse used in this experiment has the effect of resistively shielding intermediate terminal 735 from the other terminals. The resistive shielding is a consequence of the selective formation of a resistively shielding amorphous region or regions in the vicinity of intermediate terminal 735. The programming pulse applied in this example may thus be referred to as a shielding pulse with respect to terminal 735. Since shielding corresponds to the formation of a resistively shielding amorphous region or regions, a shielding pulse may also be referred to herein as an amorphizing pulse. An amorphizing pulse, more generally in the context of the instant invention, is an input signal that acts to increase the volume fraction of amorphous regions and/or the arrangement of amorphous regions between a pair of input terminals.

EXAMPLE 2

The resistive shielding of bottom terminal 715 was demonstrated in a further experiment using the device shown in FIG. 7. The device was once again initialized to a state in which the phase change material was sufficiently crystalline to provide continuous crystalline pathways between each of the three pairs of terminals in the device. The measured resistances between the terminals in this initial state were: 8 kΩ (measured resistance between terminals 715 and 750), 14 kΩ (measured resistance between terminals 715 and 735), and 6 kΩ (measured resistance between terminals 735 and 750). A programming pulse having an amplitude of ca. 2-5 mA and duration of ca. 100 ns was next applied between terminals 715 and 735. The resistances between the three pairs of terminals were subsequently measured with the following results: 1500 kΩ (measured resistance between terminals 715 and 750), 1200 kΩ (measured resistance between terminals 715 and 735), and 8.5 kΩ (measured resistance between terminals 735 and 750). The results indicate that the measured resistance between bottom terminal 715 and either terminal 735 or 750 increases dramatically, while the resistance between terminals 735 and 750 is essentially unchanged. From the point of view of the instant logic applications, the results shows that the programming pulse used in this experiment has the effect of resistively shielding bottom terminal 715 from the other terminals. The resistive shielding is a consequence of the selective formation of a resistively shielding amorphous region or regions in the vicinity of bottom terminal 715. The programming pulse applied in this example may thus be referred to as a shielding or amorphizing pulse with respect to terminal 715.

EXAMPLE 3

The preceding two examples demonstrate the selective formation of amorphous regions in the vicinity of terminals 715 and 735 through the use of appropriate amorphizing pulses. In this example, the instant inventors have completed further experiments to demonstrate the removal or disruption of amorphous regions through selective crystallization. Selective crystallization may be accomplished by application of a crystallizing signal (e.g. current or voltage) that is pulsed or persistent and that leads to sufficient conversion of a resistively shielding amorphous region to a crystalline phase to permit the flow of current emanating to or from a terminal to occur substantially through a crystalline pathway. Through application of a crystallizing signal, a resistively shielded terminal may be transformed to a non-resistively shielded terminal. More generally in the context of the instant invention, a crystallizing signal is a signal that acts to increase the crystalline volume fraction and/or arrangement of crystalline regions between a pair of input terminals.

In this example the device shown in FIG. 7 is used in an initial state in which intermediate terminal 735 is resistively shielded. The resistances between terminals in the initial state are as follows: 10 kΩ (measured resistance between terminals 715 and 750), 55 kΩ (measured resistance between terminals 715 and 735), and 67 kΩ (measured resistance between terminals 735 and 750). The high resistances measured between intermediate terminal 735 and terminals 715 and 750 evidences the presence of a resistively shielding amorphous region in the vicinity of intermediate terminal 735, while the low resistance measured between top and bottom terminals 750 and 715 evidences current flow that occurs substantially through a crystalline pathway without significant interference from the resistively shielding amorphous region or regions in the presence of intermediate terminal 735 or other resistively shielding amorphous regions.

A crystallizing current pulse having an amplitude of ca. 1-2.5 mA and a duration of ca. 600 ns was subsequently applied between intermediate terminal 735 and bottom terminal 715. After application of the crystallizing pulse, the resistance between the terminals was measured with the following results: 8 kΩ (measured resistance between terminals 715 and 750), 14 kΩ (measured resistance between terminals 715 and 735), and 6 kΩ (measured resistance between terminals 735 and 750). The measured resistance flowing to or from intermediate terminal 735 has decreased considerably and demonstrates the selective crystallization induced by the crystallizing pulse of this example. The measured resistance between top and bottom terminals 715 and 750 remains low and is not significantly influenced by the crystallizing pulse.

EXAMPLE 4

In this example the device shown in FIG. 7 is used in an initial state in which bottom terminal 715 is resistively shielded. The resistances between terminals in the initial state are as follows: 1300 kΩ (measured resistance between terminals 715 and 750), 1700 kΩ (measured resistance between terminals 715 and 735), and 5.5 kΩ (measured resistance between terminals 735 and 750). The high resistances measured between terminal 715 and terminals 735 and 750 evidences the presence of a resistively shielding amorphous region in the vicinity of bottom terminal 715, while the low resistance measured between top and intermediate terminals 750 and 735 evidences current flow that occurs substantially through a crystalline pathway without significant interference from the resistively shielding amorphous region or regions in the presence of bottom terminal 715 or other resistively shielding amorphous regions.

A crystallizing current pulse having an amplitude of ca. 1-2.5 mA and a duration of ca. 600 ns was subsequently applied between intermediate terminal 735 and bottom terminal 715. After application of the crystallizing pulse, the resistance between the terminals was measured with the following results: 30 kΩ (measured resistance between terminals 715 and 750), 34 kΩ (measured resistance between terminals 715 and 735), and 6.5 kΩ (measured resistance between terminals 735 and 750). The measured resistance flowing to or from bottom terminal 715 has decreased considerably and attests to the selective crystallization induced by the crystallizing pulse of this example. The measured resistance between top and intermediate terminals 750 and 735 remains low and is not significantly influenced by the crystallizing pulse.

EXAMPLE 5

The foregoing examples have demonstrated the ability of the instant inventors to use amorphizing and crystallizing signals to selective form or disrupt resistively shielding amorphous regions in the vicinity of selected terminals of a multi-terminal chalcogenide device to thereby selectively influence the pattern of resistances between different pairs of terminals in a multi-terminal device. In this example, the instant inventors demonstrate logic functionality of a three-terminal chalcogenide device based on the ability of input signals to increase or decrease the resistance between particular pairs of terminals through the selective amorphization or crystallization of intervening chalcogenide material. The device indicated in FIG. 7 is a representative device in accordance with the instant invention and may be used in to illustrate logic functionality. In this example, we consider use of the device shown in FIG. 7 to perform the OR logic function.

In the OR logic function, two inputs are provided to a device and processed to provide an output according to the following truth table:

| input 1 | input 2 | output |
|---------|---------|--------|
| 0 | 0 | 0 |
| 0 | 1 | 1 |
| 1 | 0 | 1 |
| 1 | 1 | 1 | where the inputs and output correspond to the binary 0 and 1 states. In a conventional logic device, the 0 and 1 states typically correspond to low and high voltages, respectively. In the instant logic devices, the measured resistance between pairs of terminals may be associated with the 0 and 1 states used to define truth tables for logic operations. In one embodiment of the instant invention, the 0 and 1 states correspond to low and high resistances, respectively, and in another embodiment, the 0 and 1 states correspond to high and low resistances, respectively. In this example, we illustrate the OR logic function and choose to let low and high measured resistances correspond to logical 0 and 1 values, respectively.

In order to comply with the logic truth table, two independent inputs and one independent output are required. In the instant logic devices, signals applied across two different pairs of terminals correspond to the requisite inputs and the resistance measured between a third pair of terminals corresponds to the output. Since the device of FIG. 7 includes three terminals, three independent pairs of terminals are present to provide three independent measured resistances and/or means for providing signals that can be associated with logical inputs and outputs. For the purposes of this example, we choose to let bottom terminal 715 and top terminal 750 be a pair of terminals corresponding to one input and intermediate terminal 735 and top terminal 750 be a pair of terminals corresponding to a second input. The measured resistance between bottom terminal 715 and intermediate terminal 735 corresponds to the output. The choice of terminals associated with the inputs and output made in this example, is used for illustrative purposes only; other schemes for assigning particular pairs of terminals to inputs and output are possible and within the scope of the instant invention.

The input signals of the logic device of this example are provided in the form of current pulses applied between a first pair of terminals (terminals 715 and 750) and a second pair of terminals (terminals 735 and 750). In this example, input signals are provided in the form of crystallizing and amorphizing pulses, respectively. As described hereinabove, a crystallizing pulse applied between a pair of terminals alters the structural state of phase change material between a pair of terminals in such a way as to promote the formation of a substantially crystalline pathway for current flow between the terminals. A crystallizing pulse may thus provide for a low measured resistance between a pair of terminals in the instant devices and, in the context of this example, constitutes an input signal that corresponds to a logic value 0. Similarly, an amorphizing pulse between a pair of terminals alters the structural state of phase change material between a pair of terminals in such a way as to promote the formation of amorphous and/or resistively shielding amorphous regions in the pathway for current flow between the terminals. An amorphizing pulse may thus provide for a high measured resistance between a pair of terminals and, in the context of this example, constitutes an input signal that corresponds to a logic value 1.

In a preferred embodiment of the instant invention, the input signals act independently and do not interfere with each other so that the portion of phase change material influenced by an input signal provided between one pair of input terminals does not materially alter the phase change material influenced by an input signal provided between a different pair of input terminals. Interference and overlap of the region of influence of signals applied between different pairs of terminals has been discussed in U.S. patent application Ser. No. 10/657,285. In this preferred embodiment, in addition to providing logic functionality, the instant devices may also provide for non-volatile storage of the input signals. A crystallizing pulse, for example, between a pair of input terminals would promote the formation of a continuous crystalline pathway between the terminals and facilitate a low measured resistance between the input terminals thereby providing for the storage of the input value 0. Similarly, application of an amorphizing signal between a pair of terminals provides for the storage of an input value 1.

The non-volatile storage of input values may be comprised where the input signals interfere with each other as where the portions of phase change materials influenced by input signals applied between different terminals overlap or where thermal energy or electrical energy emanating from one region dissipates into or otherwise influences another region as described in U.S. patent application Ser. No. 10/657,285.

Depending on the extent of interference, the interference may lead to alterations of the structural state or measured resistance between one pair of terminals when a later signal is applied to a different pair of terminals. In such circumstances, storage of the earlier input value may be volatile, rather than non-volatile, if the extent of interference is sufficient to materially alter the structural state or measured resistance between the terminals to which the earlier signal was applied.

Irrespective of any overlap or interference of the input signals, the logic outputs of the instant devices conform faithfully according to the truth tables described in the EXAMPLES herein to the input signals. Embodiments in which the input signals interfere or not are both within the scope of the instant invention as are embodiments in which the input signals are stored non-volatilely or not. Factors such as pulse amplitude, pulse voltage, pulse duration, device dimensions, selection of phase change material etc. may be used to influence whether or not signals provided across different pairs of input terminals interfere and if so, the extent of the interference. See U.S. patent application Ser. No. 10/657,285 for further information.

The output of the logic device of this example corresponds to the resistance measured between bottom terminal 715 and intermediate terminal 735 and is obtained following application of one or more input signals between one or more other pairs of terminals in the device. A high measured resistance corresponds to an output value of 1, while a low measured resistance corresponds to an output value of 0. As described hereinabove, the measured resistance is primarily influenced by the relative proportion and spatial arrangement and/or contiguousness of crystalline and amorphous regions in the current pathway between bottom terminal 715 and intermediate terminal 735. The presence of a resistively shielding amorphous regions promotes high resistance and manifestation of an output value of 1. The presence of a continuous crystalline pathway that is not saturated or otherwise limited by the current used in the resistance measurement promotes low measured resistance and manifestation of an output value of 0. Alternatively, output may be defined to be the measured current that flows between a pair of output terminals. Current output follows naturally from the resistance since a low resistance leads to a higher current for a given voltage than does high resistance. Thus, the level of current (high vs. low) may also be used as an output signal in the devices of the instant invention. In this example, we consider output in terms of measured resistance.

Since the resistance of a phase change material varies with the composition of the phase change material, the measured resistance for a particular volume fraction and arrangement of crystalline and/or amorphous regions in a logic device according to the instant invention varies with the phase change material used in the device. The determination of whether a particular measured resistance is high or low, and consequently whether a particular output is a 1 or a 0, may depend on the choice of phase change material used in the device. In one embodiment of the instant invention, specific resistance values may be assigned to high and low resistance output states. In another embodiment, a reference resistance may be selected where measured output resistances exceeding the reference resistance correspond to high resistance and an output of 1 and where measured output resistances below the reference resistance correspond to low resistance and an output of 0. Since the measured resistance between the amorphous and crystalline phases typically differs by at least a factor of two and oftentimes by an order of magnitude or more, it is straightforward to establish a reference resistance that unambiguously delineates high and low output values. The practical ease with which even small differences in resistance can be reliably measured further facilitates and makes flexible the choice of a reference resistance.

A summary of the operating characteristics of this embodiment of the instant logic device is presented in the table below. Input 1 is the input signal applied between terminals 715 and 750, input 2 is the input signal applied between terminals 735 and 750, and the output is the measured resistance between 735 and 750 after application of the two input signals. The inputs are listed as crystallizing or amorphizing pulses, where the pulse amplitude and durations are comparable to those described in EXAMPLES 1-4 hereinabove.

| Input 1 | | Input 2 | | Output | | |
|---|---|---|---|---|---|---|
| pulse type | value | pulse type | value | resistance (kΩ) | designation | value |
| crystallizing | 0 | crystallizing | 0 | 14 | low | 0 |
| crystallizing | 0 | amorphizing | 1 | 50 | high | 1 |
| amorphizing | 1 | crystallizing | 0 | 1200 | high | 1 |
| amorphizing | 1 | amorphizing | 1 | 800 | high | 1 |

In this example, the outputs are determined with respect to a reference resistance of 20 kΩ. Any resistance between 14 and 50 kΩ would serve as a proper reference resistance in this example. Examination of the relationship between the inputs and outputs shows that the device of this example performs the logic OR operation.

EXAMPLE 6

In this example, an example of a device that performs the logic AND operation is described. The device in this example correspond to that described in EXAMPLE 5 hereinabove, but the procedure for associating logic values with resistances differs. In the foregoing EXAMPLE 5, the logic value 0 is assigned to a crystallizing input signal, the logic value 1 is assigned to an amorphizing input signal, and output values of 0 and 1 are assigned to low and high output resistances, respectively.

In this example, a different assignment of logic values is made. Specifically, the logic value 0 is assigned to an amorphizing input signal, the logic value 1 is assigned to a crystallizing input signal and output values of 0 and 1 are assigned to high and low resistance outputs, respectively. As in the foregoing EXAMPLE 5, the input signals of the logic device of this example are provided in the form of current pulses applied between a first pair of terminals (terminals 715 and 750) and a second pair of terminals (terminals 735 and 750) and the output corresponds to the resistance measured between bottom terminal 715 and intermediate terminal 735. Using as input signals the pulses described in EXAMPLE 5, a reference resistance between 14 and 50 kΩ, and the alternative assignment of logic values described for this example, the following table of output characteristics is obtained:

| Input 1 | | Input 2 | | Output | | |
|---|---|---|---|---|---|---|
| pulse type | value | pulse type | value | resistance (kΩ) | designation | value |
| crystallizing | 1 | crystallizing | 1 | 14 | low | 1 |
| crystallizing | 1 | amorphizing | 0 | 50 | high | 0 |
| amorphizing | 0 | crystallizing | 1 | 1200 | high | 0 |
| amorphizing | 0 | amorphizing | 0 | 800 | high | 0 |

This example thus demonstrates logic according to AND functionality.

EXAMPLE 7

In this example, a further mode of operation of the devices of this invention is demonstrated. In particular, a method of operating is shown in which the application of a signal between one pair of terminals permits a modification of the structural state of the phase change material in the vicinity of another terminal of the device. In this experiment, the device shown in FIG. 7 was used and was placed into an initial state in which the phase change material was sufficiently crystalline to provide a continuous crystalline pathway between each of the three pairs of terminals of the device. The measured resistances between the terminals in the initial state were: 8.5 kΩ (measured resistance between terminals 715 and 750), 14 kΩ (measured resistance between terminals 715 and 735), and 4 kΩ (measured resistance between terminals 735 and 750). A first programming pulse having an amplitude of ca. 1-5 mA and duration of ca. 100 ns was next applied between terminals 735 and 750. The resistances between the three pairs of terminals were subsequently measured with the following results: 8 kΩ (measured resistance between terminals 715 and 750), 50 kΩ (measured resistance between terminals 715 and 735), and 34 kΩ (measured resistance between terminals 735 and 750). The results indicate that the measured resistance between bottom terminal 715 and top terminal 750 is large unaffected by the signal that was applied between intermediate terminal 735 and top terminal 750, while the measured resistance between top terminal 750 and intermediate terminal 735 increases and the measured resistance between intermediate terminal 735 and bottom terminal 715 increases.

Since the resistance between bottom terminal 715 and top terminal 750 remained approximately constant, application of the signal between intermediate terminal 735 and top terminal 750 in this example did not have a material effect on the structural state or crystallinity of the chalcogenide material in the vicinity of or adjacent to either the bottom terminal 715 or the top terminal 750. The increased resistances measured between intermediate terminal 735 and top terminal 750 and between intermediate terminal 735 and bottom terminal 715 may thus be attributed to an alteration of the structural state of the chalcogenide material adjacent to or in the vicinity of intermediate terminal 735. More specifically, application of the signal transformed the chalcogenide material adjacent to or in the vicinity of intermediate terminal 735 to a more resistive state through a conversion of a portion of the material to an amorphous phase.

The experiment was continued by applying a second pulse to the device in the state produced by the first pulse. The second pulse was applied between top terminal 750 and bottom terminal 715. The resistances between the three pairs of terminals were measured after conclusion of the second pulse and the following results were obtained: 430 kΩ (measured resistance between terminals 715 and 750), 800 kΩ (measured resistance between terminals 715 and 735), and 3 kΩ (measured resistance between terminals 735 and 750). The low resistance measured between intermediate terminal 735 and top terminal 750 indicates that the chalcogenide material adjacent to each of these terminals is in a substantially crystalline structural state. The high resistance measured between bottom terminal 715 and top terminal 750 and the high resistance measured between intermediate terminal 735 and bottom terminal 715 are thus attributable to the presence of a resistively shielding amorphous region of chalcogenide material adjacent to or in the vicinity of bottom terminal 715.

A third pulse was next applied to the device in the state produced by the second pulse. The third signal was applied between top terminal 750 and intermediate terminal 735. The resistances between the three pairs of terminals were measured after conclusion of the third pulse and the following results were obtained: 10 kΩ (measured resistance between terminals 715 and 750), 55 kΩ (measured resistance between terminals 715 and 735), and 67 kΩ (measured resistance between terminals 735 and 750). As noted above, the application of a pulse between top terminal 750 and intermediate terminal 735 is expected to influence the structural state of the chalcogenide material adjacent to the intermediate terminal 735. The increase from 3 kΩ to 67 kΩ in the resistance measured between intermediate terminal 735 and top terminal 750 is thus attributable to an increase in the resistance of the chalcogenide material adjacent to intermediate terminal 735 due to an increase in its volume fraction of amorphous phase. An increase in the resistance of the chalcogenide material in the vicinity of intermediate terminal 735 would be expected to contribute to an increase in the resistance measured between intermediate terminal 735 and bottom terminal 715, but the experiment indicates that the latter resistance decreased from 800 kΩ to 55 kΩ. This decrease is attributable to a counteracting alteration of the structural state of the chalcogenide material adjacent to bottom terminal 715. As noted above, application of the second pulse produced a resistively shielding amorphous region of chalcogenide material adjacent to bottom terminal 715. The results following application of the third pulse indicate that the chalcogenide material adjacent to bottom terminal 715 has become less amorphous and more crystalline. The extent of the structural modification of the chalcogenide material adjacent to bottom terminal 715 is sufficient to produce a net decrease in the resistance measured between intermediate terminal 735 and bottom terminal 715 even though the chalcogenide material adjacent to intermediate terminal 735 has transformed to a more resistive state. An even more pronounced decrease in resistance was measured between top terminal 750 and bottom terminal 715 after application of the third pulse. This decrease is a consequence of the structural transformation of the chalcogenide material adjacent to bottom terminal 715 to a more conductive state as noted above and is more pronounced than the decrease observed between intermediate terminal 735 and bottom terminal 715 because it is not influenced by the increased resistance of the chalcogenide material that occurred adjacent to intermediate terminal 735.

This example demonstrates that the application of energy between a pair of terminals of a multi-terminal device can influence the state of an active material adjacent to other terminals of the device. In a preferred embodiment, the active material is capable of transforming between a first state and a second state, where the two states differ in resistance. The results in the illustrated embodiment of this example indicate that application of an electrical pulse between the intermediate and top terminals of a three-terminal device alters the structural state of the chalcogenide material adjacent to the bottom terminal of the three-terminal device. The result of this example is general and extends to any material, chalcogenide or otherwise, capable of undergoing a transformation between two or more states that differ in resistance or other property upon application of energy. In a preferred embodiment, the two or more states correspond to structural states of the material, such as those accompanying a phase transformation. In one preferred embodiment, the energy is applied in the form of electrical energy. In another preferred embodiment, the energy is applied in the form of thermal energy, such as the thermal energy that accompanies an electrical signal.

Although the foregoing illustrative examples have emphasized devices having three terminals in electrical communication with a phase change material, it is evident that the principles of operation and logic functionality extend analogously to multi-terminals devices generally. Two or more input signals may be applied to different pairs of input terminals and one or more output signals may be obtained by measuring the resistance between different pairs of output terminals. Logic functionality can analogously be defined in terms of the relationship between the types of input signals (e.g. crystallizing or amorphizing, low or high, 0 or 1 etc.) applied, the number of each type of input signal and the output signal or signals. As in the three-terminal embodimentsillustrated hereinabove, truth tables may be developed for logic operations of multi-terminal devices.

The disclosure and discussion set forth herein is illustrative and not intended to limit the practice of the instant invention. While there have been described what are believed to be the preferred embodiments of the instant invention, those skilled in the art will recognize that other and further changes and modifications may be made thereto without departing from the spirit of the invention, and it is intended to claim all such changes and modifications that fall within the full scope of the invention. It is the following claims, including all equivalents, in combination with the foregoing disclosure and knowledge commonly available to persons of skill in the art, which define the scope of the instant invention.

We claim:

1. A method of operating an electronic device, said electronic device comprising an active material having a first state and a second state, said first and second states differing in resistance; a first terminal in contact with said active material; a second terminal in contact with said active material; a third terminal in contact with said active material; said active material extending continuously between said first terminal and said second terminal from said first terminal to said second terminal; said method comprising the step of:

providing energy between said first terminal and said second terminal;

wherein said providing energy step induces a transformation of said active material from said first state to said second state, said transformation occurring adjacent to said third terminal.

2. The method of claim 1, wherein said active material is a phase change material.

3. The method of claim 1, wherein said active material is a chalcogenide material.

4. The method of claim 3, wherein said chalcogenide material comprises Se or Te.

5. The method of claim 4, wherein said chalcogenide material further comprises Ge or Sb.

6. The method of claim 4, wherein said chalcogenide material further comprises As or Si.

7. The method of claim 1, wherein said first state is a crystalline state.

8. The method of claim 7, wherein said second state is an amorphous state.

9. The method of claim 1, wherein said first and second states comprise a crystalline phase and an amorphous phase and the volume fraction of said crystalline phase of said first state differs from the volume fraction of said crystalline phase of said second state.

10. The method of claim 1, wherein the resistance of said first state and the resistance of said second state differ by a factor at least two.

11. The method of claim 1, wherein the resistance of said first state and the resistance of said second state differ by a factor at least ten.

12. The method of claim 1, wherein one of said terminals includes a barrier layer.

13. The method of claim 1, wherein said third terminal is spaced apart from said first terminal and said second terminal.

* * * * *